United States Patent

Fang

(10) Patent No.: US 9,590,043 B2
(45) Date of Patent: Mar. 7, 2017

(54) SEMICONDUCTOR DEVICE AND METHOD OF MANUFACTURING THE SAME

(71) Applicant: Semiconductor Manufacturing International (Shanghai) Corporation, Shanghai (CN)

(72) Inventor: Lei Fang, Shanghai (CN)

(73) Assignee: Semiconductor Manufacturing International (Shanghai) Corporation (CN)

(*) Notice: Subject to any disclaimer, the term of this patent is extended or adjusted under 35 U.S.C. 154(b) by 0 days.

(21) Appl. No.: 14/788,009

(22) Filed: Jun. 30, 2015

(65) Prior Publication Data

US 2016/0035884 A1    Feb. 4, 2016

(30) Foreign Application Priority Data

Jul. 30, 2014    (CN) .......................... 2014 1 0369929

(51) Int. Cl.
| | |
|---|---|
| *H01L 29/10* | (2006.01) |
| *H01L 29/66* | (2006.01) |
| *H01L 29/78* | (2006.01) |
| *H01L 21/265* | (2006.01) |

(52) U.S. Cl.
CPC .... *H01L 29/1095* (2013.01); *H01L 29/66659* (2013.01); *H01L 29/7835* (2013.01); *H01L 21/26586* (2013.01)

(58) Field of Classification Search
CPC ............. H01L 29/1095; H01L 29/7835; H01L 29/66659; H01L 21/26586
See application file for complete search history.

(56) References Cited

U.S. PATENT DOCUMENTS

| | | | |
|---|---|---|---|
| 6,486,034 B1 | 11/2002 | Huang et al. | |
| 6,897,525 B1 | 5/2005 | Kikuchi et al. | |
| 2005/0106791 A1* | 5/2005 | You | H01L 29/7833 438/197 |
| 2008/0308867 A1* | 12/2008 | Cai | H01L 29/458 257/348 |
| 2009/0273028 A1* | 11/2009 | Mallikarjunaswamy | H01L 21/26513 257/335 |
| 2010/0032756 A1 | 2/2010 | Pendharkar et al. | |
| 2011/0070709 A1* | 3/2011 | Lo | H01L 21/26586 438/286 |
| 2013/0341716 A1* | 12/2013 | Sakamoto | H01L 21/823412 257/336 |

* cited by examiner

*Primary Examiner* — Zandra Smith
*Assistant Examiner* — Lauren R Bell
(74) *Attorney, Agent, or Firm* — Innovation Counsel LLP (57) ABSTRACT

A semiconductor device includes a semiconductor substrate, and a P-well and an N-type drift region disposed in the semiconductor substrate. The P-well includes a lower well region and an upper well region disposed above the lower well region. The lower well region includes a first surface that is near the N-type drift region, and the upper well region includes a second surface that is near the N-type drift region. A distance from the first surface of the lower well region to the N-type drift region is greater than a distance from the second surface of the upper well region to the N-type drift region.

7 Claims, 5 Drawing Sheets

Step S101: forming a mask layer on a semiconductor substrate, wherein the mask layer is used in forming a P-well; and performing a first ion implantation on the semiconductor substrate through the mask layer to form a lower well region, wherein an implantation angle of the first ion implantation is an acute angle Step S102: performing a second ion implantation on the semiconductor substrate through the mask layer so as to form an upper well region, wherein an implantation angle of the second ion implantation process is zero degree, wherein the upper well region is disposed above the lower well region, wherein the upper well region and the lower well region collectively constitute the P-well, wherein the lower well region includes a first surface that is near the N-type drift region, and the upper well region includes a second surface that is near the N-type drift region, and wherein a distance from the first surface of the lower well region to the N-type drift region is greater than a distance from the second surface of the upper well region to the N-type drift region Step S103: removing the mask layer

FIG. 4

SEMICONDUCTOR DEVICE AND METHOD OF MANUFACTURING THE SAME

CROSS-REFERENCE TO RELATED APPLICATION

This application claims priority to Chinese Patent Application No. 201410369929.1 filed Jul. 30, 2014, the disclosure of which is incorporated herein by reference in its entirety.

BACKGROUND

Technical Field

The present disclosure generally relates to the field of semiconductor technology, and more particularly to a semiconductor device and a method of manufacturing the same.

Description of the Related Art

In the field of semiconductor technology, laterally diffused metal oxide semiconductor (LDMOS) can be used in many applications. For example, LDMOS is typically an important component in power devices.

However, as high power device applications continue to develop, the existing LDMOS is often unable to simultaneously meet both breakdown voltage (BV) and device performance requirements. As a result, breakdown voltage (BV) and device performance considerations need to be balanced when designing an LDMOS for high power device applications.

SUMMARY

The present disclosure addresses at least the above deficiencies in the prior art, by disclosing a semiconductor device having both higher breakdown voltage and improved device performance.

According to an embodiment of the inventive concept, a semiconductor device is provided. The semiconductor device includes: a semiconductor substrate; a P-well and an N-type drift region disposed in the semiconductor substrate, wherein the P-well includes a lower well region and an upper well region disposed above the lower well region, wherein the lower well region includes a first surface that is near the N-type drift region, and the upper well region includes a second surface that is near the N-type drift region, and wherein a distance from the first surface of the lower well region to the N-type drift region is greater than a distance from the second surface of the upper well region to the N-type drift region.

In some embodiments, the first surface of the lower well region may be a sloped surface, and a distance from an upper portion of the sloped surface to the N-type drift region may be less than a distance from a lower portion of the sloped surface to the N-type drift region.

In some embodiments, the lower well region may be formed through an ion implantation process, and an implantation angle of the ion implantation process may be an acute angle.

In some embodiments, the semiconductor device may further include a source disposed in the P-well electrode, a drain disposed in the N-type drain drift region, and a gate disposed on the semiconductor substrate.

In some embodiments, the semiconductor device may further include a body electrode disposed in the P-well.

According to another embodiment of the inventive concept, a method of manufacturing a semiconductor device is provided. The method includes forming an N-type drift region and a P-well in a semiconductor substrate. The forming of the P-well further comprises: forming a mask layer on the semiconductor substrate; performing a first ion implantation on the semiconductor substrate through the mask layer so as to form a lower well region, wherein an implantation angle of the first ion implantation process is an acute angle; performing a second ion implantation on the semiconductor substrate through the mask layer so as to form an upper well region, wherein an implantation angle of the second ion implantation process is zero degree, wherein the upper well region is disposed above the lower well region, wherein the upper well region and the lower well region collectively constitute the P-well, wherein the lower well region includes a first surface that is near the N-type drift region, and the upper well region includes a second surface that is near the N-type drift region, and wherein a distance from the first surface of the lower well region to the N-type drift region is greater than a distance from the second surface of the upper well region to the N-type drift region; and removing the mask layer.

In some embodiments, the first surface of the lower well region may be a sloped surface, and a distance from an upper portion of the sloped surface to the N-type drift region may be less than a distance from a lower portion of the sloped surface to the N-type drift region.

In some embodiments, the first ion implantation may have an energy ranging from about 480 Kev to about 1000 Kev, and an ion dosage ranging from about $1\times10^{12}/\text{cm}^3$ to about $5\times10^{12}/\text{cm}^3$.

In some embodiments, the first ion implantation may include using boron ions, and the implantation angle of the first ion implantation process may range from about 5 degrees to about 45 degrees.

In some embodiments, the second ion implantation may have an energy ranging from about 0 Kev to about 480 Kev, and an ion dosage greater than about $3\times10^{12}/\text{cm}^3$.

In some embodiments, the second ion implantation may include using boron ions.

In some embodiments, the method may further include: forming a source in the P-well, a drain in the N-type drift region, and a gate on the semiconductor substrate.

According to a further embodiment of the inventive concept, an electronic apparatus is provided. The electronic apparatus includes a semiconductor device and at least one electronic component connected to the semiconductor device. The semiconductor device comprises: a semiconductor substrate; a P-well and an N-type drift region disposed in the semiconductor substrate, wherein the P-well includes a lower well region and an upper well region disposed above the lower well region, wherein the lower well region includes a first surface that is near the N-type drift region, and the upper well region includes a second surface that is near the N-type drift region, and wherein a distance from the first surface of the lower well region to the N-type drift region is greater than a distance from the second surface of the upper well region to the N-type drift region.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale. In the drawings, the size and/or relative sizes of layers and regions may be exaggerated for clarity. Like reference numerals denote the same elements throughout.

Ordinary skill in the relevant art known techniques, methods and apparatus may not be discussed in detail, but in the application of these techniques, methods and apparatus, these techniques, methods and apparatus should be considered as part of this specification.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

It should be understood that when an element or layer is referred to as "in", "on", "adjacent to", "connected to", or "coupled to" another element or layer, it can be directly on the other element or layer, adjacent, connected or coupled to the other element or layer, or with one or more intervening elements or layers being present. In contrast, when an element is referred to as being "directly on," "directly adjacent with", "directly connected to" or "directly coupled to" another element or layer, no intervening elements or layers are present.

It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "below," "lower," "under," "above," "upper" and the like, may be used herein to describe the spatial relationship of one element or feature to another element(s) or feature(s) as illustrated in the figures. It will be understood that the spatially relative terms are intended to encompass different orientations of the device during use or operation, in addition to the orientation depicted in the figures. For example, if the device in the figures is turned over, elements described as "below" or "beneath" relative to other elements or features would then be oriented "above" relative to the other elements or features. Thus, the example term "below" can encompass both an orientation of above and below, depending on the orientation of the elements. The device may be otherwise oriented (rotated 90 degrees or at other orientations) and the spatially relative descriptors used herein interpreted accordingly.

The inventive concept will be herein described with reference to cross-sections of intermediate and final structures of different embodiments. The cross-sections are merely illustrative and are not drawn to scale. Furthermore, it should be noted that the shapes of the intermediate and final structures may vary due to different tolerances in manufacturing. As such, the inventive concept is not limited to the embodiments illustrated in the drawings, but may further include variations in shapes as a result of different manufacturing tolerances. For example, an implanted region (depicted as a rectangle in the drawings) may have generally rounded or curved edges depending on the gradient in the ion implant concentration. Therefore, the areas/shapes illustrated in the figures are merely schematic, and should not be construed to limit the inventive concept.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

It should be understood that the inventive concept is not limited to the embodiments described herein. Rather, the inventive concept may be modified in different ways to realize different embodiments.

Figure 1:
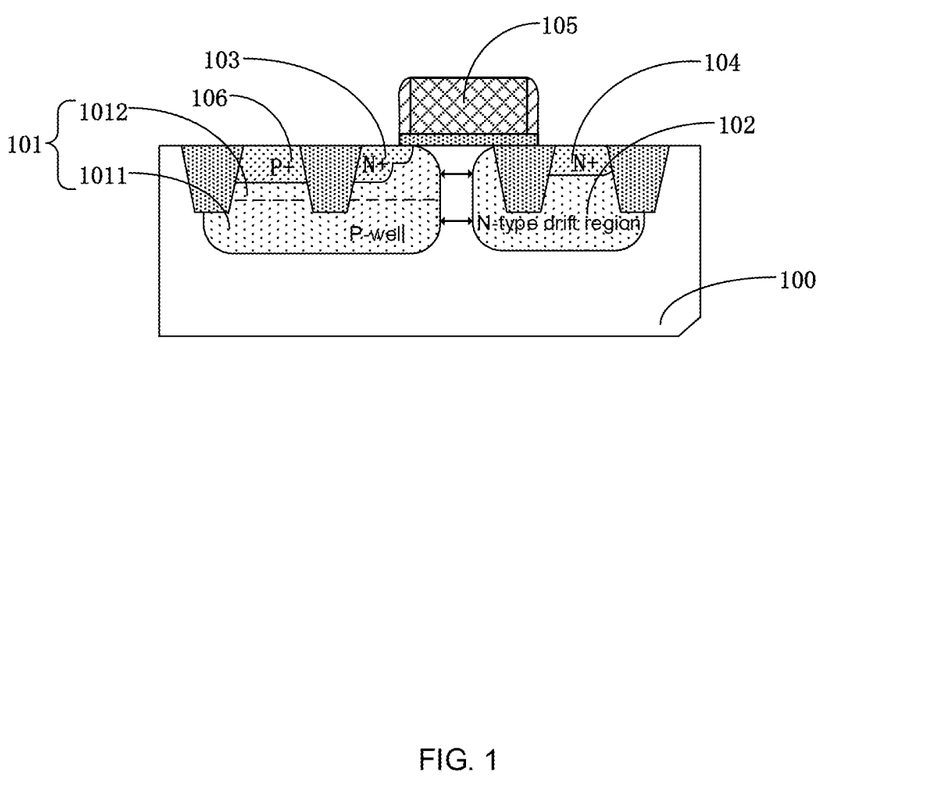
FIG. 1 illustrates a cross-sectional view of a LDMOS.

FIG. 1 illustrates the structure of a semiconductor device, specifically that of a laterally diffused metal oxide semiconductor (LDMOS). As shown in FIG. 1, the LDMOS includes a semiconductor substrate 100, a P-well 101 and an N-drain drift region 102 disposed in the semiconductor substrate 100, a source 103 disposed in the P-well 101, a drain 104 disposed in the N-drain drift region 102, a gate 105 disposed on the semiconductor substrate 100, and an electrode 106 disposed in the P-well 101. The P-well 101 includes a lower well region 1011 and an upper well region 1012 above the lower well region 1011. A distance between a right surface of the lower well region 1011 and a left surface of the N-drain drift region 102 is substantially the same as a distance between a right surface of the upper well region 1012 and the left surface of the N-drain drift region 102, for example, as denoted by the arrows in FIG. 1.

Low energy N-type ion implantation may be used to form the N-drain drift region 102, and P-type ion implantation may be used to form the P-well 101. The N-drain drift region 102 and the P-well 101 may be formed by directional ion implantation (for example, the direction of the ion implantation may be perpendicular to a top surface of the semiconductor substrate 100).

In forming the P-well 101, high energy ion implantation is typically used to form the lower well region 1011 and low energy ion implantation is typically used to form the upper well region 1012. A same mask may be used in both the high and low energy ion implantations to form the lower/upper well regions 1011/1012. Since the same mask is used in both the high and low energy ion implantations, the distance between the right surface of the lower well region 1011 and the left surface of the N-drain drift region 102 will be substantially the same as the distance between the right surface of the upper well region 1012 and the left surface of the N-drain drift region 102.

Generally, the saturated drain current (IdSat) increases as the upper well region 1012 gets closer to the N-drain drift region 102, which improves the performance of the LDMOS. Conversely, the breakdown voltage (BV) of the LDMOS decreases as the lower well region 1011 gets closer to the N-drain drift region 102. Since the distance between the right surface of the lower well region 1011 and the left surface of the N-drain drift region 102 is substantially the same as the distance between the right surface of the upper well region 1012 and the left surface of the N-drain drift region 102, it is often difficult to maintain the performance of the LDMOS while improving the breakdown voltage conditions. Likewise, it is often difficult to maintain the breakdown voltage conditions while improving the performance of the LDMOS. As a result, the LDMOS of FIG. 1 may be unable to simultaneously meet both breakdown voltage (BV) and device performance requirements.

Figure 2:
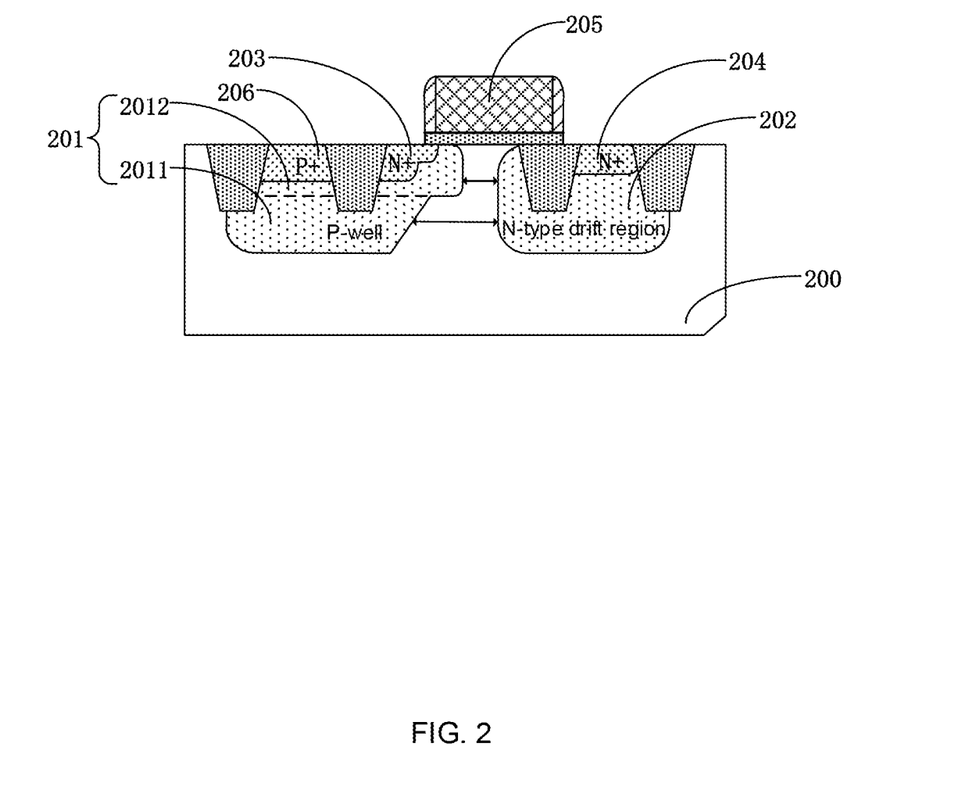
FIG. 2 illustrates a cross-sectional view of a semiconductor device according to an embodiment.

FIG. 2 illustrates a cross-sectional view of a semiconductor device according to an embodiment. The semiconductor device may be an LDMOS. The semiconductor device may also include devices including an LDMOS. In contrast to the LDMOS of FIG. 1, the semiconductor device of FIG. 2 can meet both high breakdown voltage and improved device performance requirements.

Referring to FIG. 2, the semiconductor device includes a semiconductor substrate 200, a P-well 201 and an N-drain drift region 202 disposed in the semiconductor substrate 200, a source 203 disposed in the P-well 201, a drain 204 disposed in the N-drain drift region 202, and a gate 205 disposed on the semiconductor substrate 200. The P-well 201 includes a lower well region 2011 and an upper well region 2012 above the lower well region 2011. The upper well region 2012 serves as a channel of the semiconductor device.

The lower well region 2011 includes a first surface that is near the N-type drift region 202, and the upper well region 2012 includes a second surface that is near the N-type drift region 202. A distance from the first surface of the lower well region 2011 to the N-type drift region 202 is greater than a distance from the second surface of the upper well region 2012 to the N-type drift region 202, for example, as denoted by the arrows in FIG. 2.

In the semiconductor device of FIG. 2, the breakdown voltage (BV) is mainly influenced by the lower well region 2011, while the device performance is mainly influenced by the upper well region 2012. Accordingly, the breakdown voltage (BV) increases as the distance between the N-type drift region 202 and the lower well region 2011 increases.

In the embodiment of FIG. 2, the distance from the right surface of the lower well region 2011 of the P-well 201 to the N-type drift region 202 is greater than the distance from the right surface of the upper well region 2012 of the P-well 201 to the N-type drift region 202. Accordingly, the exemplary semiconductor device of FIG. 2 has a higher breakdown voltage compared to a conventional LDMOS having a same saturated drain current (IdSat) as the exemplary semiconductor device.

In one embodiment, the first surface of the lower well region is a sloped surface, and a distance from an upper portion of the sloped surface to the N-type drift region is less than a distance from a lower portion of the sloped surface to the N-type drift region, as illustrated in FIG. 2. In other words, the surface of the lower well region 2011 that is near the N-type drift region 202 is sloped. The sloped surface corresponds to a surface of the lower well region 2011 that is non-perpendicular to the top surface of the semiconductor substrate 200. The sloped surface may be flat or arc-shaped. The sloped surface enables the exemplary semiconductor device to have a higher breakdown voltage compared to a conventional LDMOS having a same saturated drain current (IdSat) as the exemplary semiconductor device.

In some alternative embodiments, the surface of the lower well region 2011 that is near the N-type drift region 202 may be perpendicular to the top planar surface of the semiconductor substrate 200.

In the embodiment of FIG. 2, high energy ion implantation is used to form the lower well region 2011 and low energy ion implantation is used to form the upper well region 2012. A same mask may be used in both the high and low energy ion implantations to form the lower/upper well regions 2011/2012. To ensure that the surface of the lower well region 2011 that is near the N-type drift region 202 is sloped, the high energy ion implantation for forming the lower well region 2011 is performed such that an implantation angle of the high energy ion implantation is an acute angle. The implantation angle corresponds to an angle formed between a direction of the ion implantation and another direction perpendicular to the top surface of the semiconductor substrate 200. In the example of FIG. 1, the high energy ion implantation for forming the lower well region 1011 has an implantation angle of zero degree. In contrast, in the embodiment of FIG. 2, the high energy ion implantation for forming the lower well region 2011 has an implantation angle ranging from about 5 degrees to about 45 degrees. In some embodiments, the high energy ion implantation for forming the lower well region 2011 has an implantation angle of about 15 degrees or about 30 degrees.

In the embodiment of FIG. 2, the gate 205 includes a gate dielectric layer and a gate electrode located above the gate dielectric layer. The semiconductor device may further include gate sidewalls disposed on both sides of the gate 205.

As shown in FIG. 2, the semiconductor device further includes an electrode 206 in the P-well 201. In some embodiments, the semiconductor device may further include a shallow trench isolation (STI) in the P-well 201 and the N-type drift region 202. The electrode 206 and the source 203 are isolated by the shallow trench isolation (STI).

The semiconductor substrate 200 may be a single crystal silicon substrate, silicon-on-insulator (SOI) substrate, or any other suitable substrate. The shallow trench isolation (STI) may be made of silicon oxide or any other suitable material. The gate 205 may be made of polysilicon or a metal. The gate dielectric layer and the gate sidewall may be made of various dielectric materials, for example, silicon oxide.

As previously mentioned, in the embodiment of FIG. 2, the distance from the right side surface of the lower well region 2011 of the P-well 201 to the N-type drift region 202 is greater than the distance from the right side surface of the upper well region 2012 of the P-well 201 to the N-type drift region 202. As a result, the exemplary semiconductor device will have a higher breakdown voltage compared to a conventional LDMOS having a same saturated drain current (IdSat) as the exemplary semiconductor device. Accordingly, the exemplary semiconductor device has both higher breakdown voltage and improved performance.

Figure 3A:
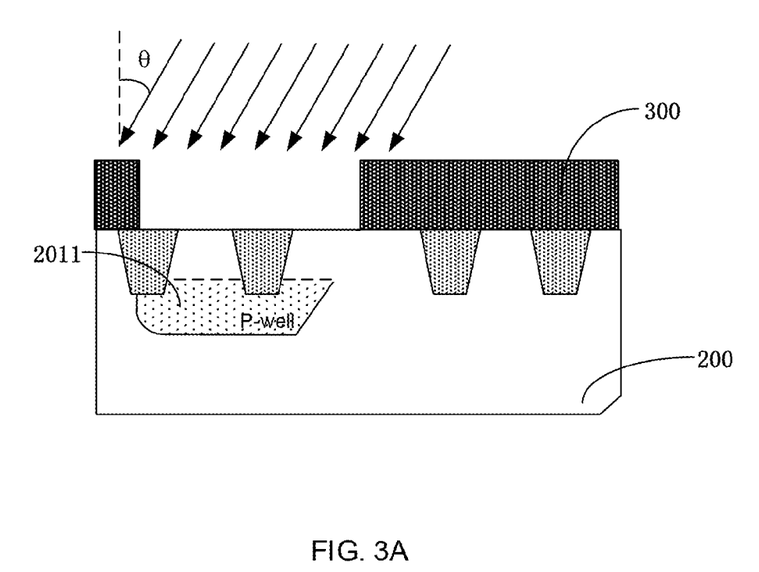
FIGS. 3A, 3B, 3C, and 3D depict cross-sectional views of a semiconductor device at different stages of manufacture according to an exemplary method of manufacturing the semiconductor device.
Figure 3B:
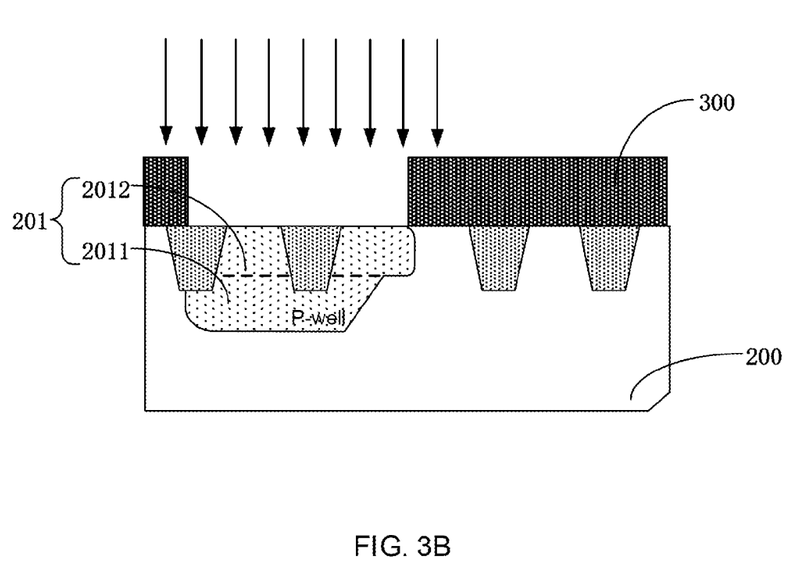
Figure 3C:
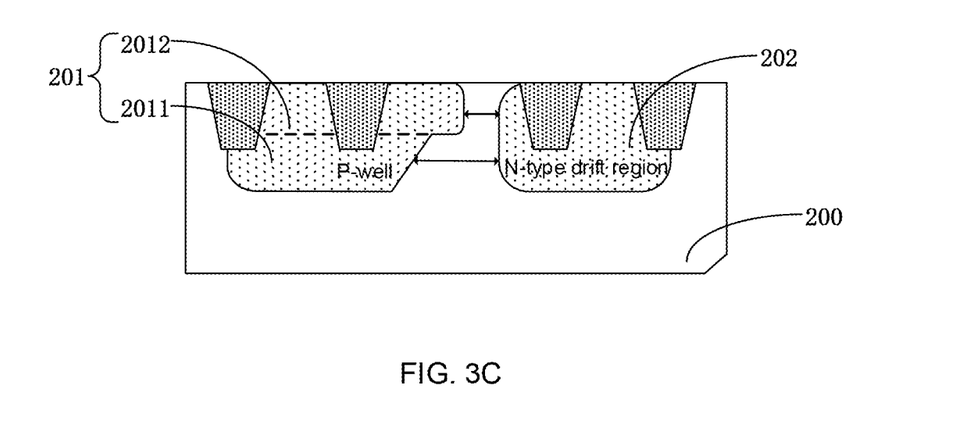
Figure 3D:
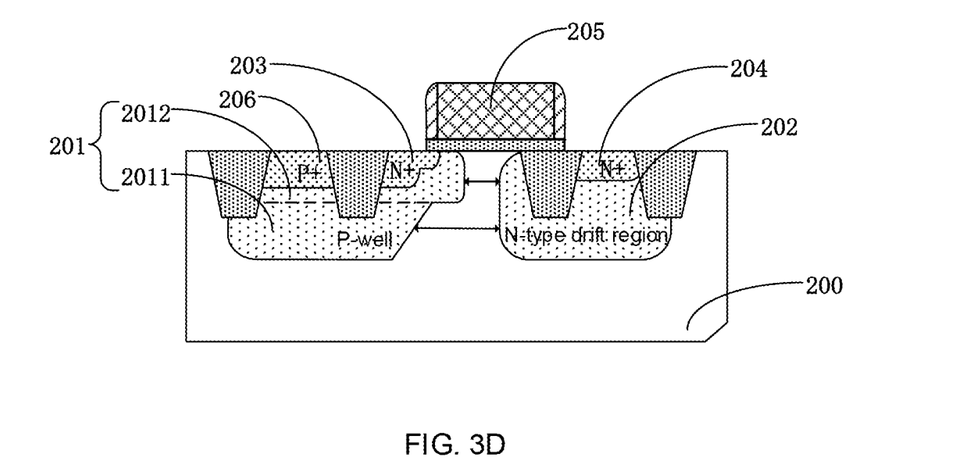
Figure 4:
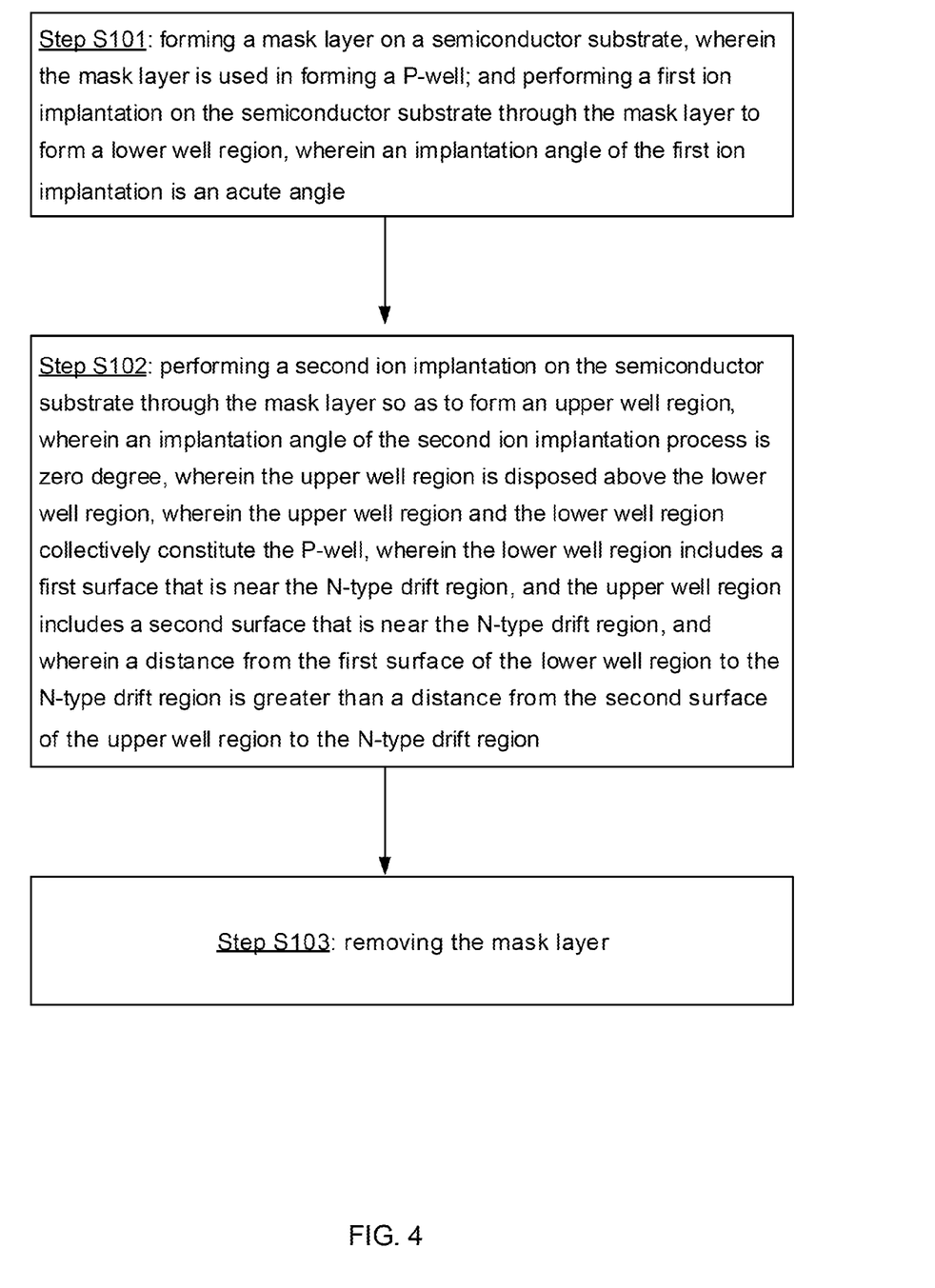
FIG. 4 is a flowchart illustrating a method of manufacturing a semiconductor device according to an embodiment.

Next, a method of manufacturing a semiconductor device according to an embodiment will be described with reference to FIGS. 3A, 3B, 3C, 3D, and 4. The semiconductor device may be an LDMOS, or a device including an LDMOS. FIGS. 3A, 3B, 3C, and 3D depict cross-sectional views of the semiconductor device at different stages of manufacture according to the exemplary method. FIG. 4 is a flowchart of the exemplary method.

Referring to FIGS. 3A through 3D, the exemplary method includes the following steps:

Step A1: A mask layer 300 is formed on a semiconductor substrate 200. The mask layer 300 is used to form a P-well. Specifically, a first ion implantation is performed on the semiconductor substrate 200 through the mask layer 300 so as to form a lower well region 2011 of the P-well. An implantation angle of the first ion implantation is an acute angle θ, as illustrated in FIG. 3A. The implantation angle refers to an angle formed between a direction of the ion implantation and another direction perpendicular to the top surface of the semiconductor substrate 200.

By performing the first ion implantation at an acute angle, the surface of the lower well region 2011 (that is near a N-type drift region) can be rendered having a sloped surface. A distance from a top portion of the sloped surface to the N-type drift region is less than a distance from a bottom portion of the sloped surface to the N-type drift region 202, as described later.

In one embodiment, the first ion implantation includes using boron (B) ions with the following process conditions: an energy ranging from about 480 Kev to about 1000 Kev, and an ion dosage ranging from about $1\times10^{12}/cm^3$ to about $5\times10^{12}/cm^3$. The implantation angle of the first ion implantation may range from about 5 degrees to about 45 degrees. In some embodiments, the implantation angle of the first ion implantation may be about 15 degrees or about 30 degrees.

Step A2: A second ion implantation is performed on the semiconductor substrate 200 through the mask layer 300 so as to form an upper well region 2012 of the P-well. The implantation angle of the second ion implantation may be zero degree. In other words, the second ion implantation is performed in a direction perpendicular to the top surface of the semiconductor substrate 200. The upper well region 2012 and the lower well region 2011 collectively constitute a P-well 201, as shown in FIG. 3B.

As described above, the second ion implantation and the first ion implantation uses the same mask layer 300, the implantation angle of the first ion implantation is an acute angle, and the implantation angle of the second ion implantation is zero degree.

In some embodiments, the second ion implantation may include using boron (B) ions (B) with the following process conditions: an energy ranging from about 0 Kev to about 480 Kev, and an ion dosage greater than about $3\times10^{12}/cm^3$.

Step A3: Removing the mask layer 300, and forming an N-type drift region 202 in the semiconductor substrate 200, as shown in FIG. 3C.

It should be noted that the N-type drift region 202 may be formed using various methods known to one of ordinary skill in the art.

The lower well region 2011 includes a first surface that is near the N-type drift region 202, and the upper well region 2012 includes a second surface that is near the N-type drift region 202. A distance from the first surface of the lower well region 2011 to the N-type drift region 202 is greater than a distance from the second surface of the upper well region 2012 to the N-type drift region 202, for example, as denoted by the arrows in FIG. 3C.

Step A4: Forming a source 203 in the P-well 201, a drain 204 in the N-type drift region 202, and a gate 205 on the semiconductor substrate 200, as shown in FIG. 3D. In some embodiments, an electrode 206 may be formed in the P-well 201.

It should be noted that the source 203, drain 204, gate 205, and electrode 206 may be formed using various methods known to one of ordinary skill in the art.

A method of manufacturing a semiconductor device according to an embodiment has been described above. One of ordinary skill in the art would appreciate that the exemplary method can be modified in various ways. For example, in some embodiments, the N-type drift region 202 may be formed prior to forming the P-well 201 (i.e. Step A3 may occur before Steps A1 and A2).

By forming the P-well 201 using the first ion implantation and the second ion implantation (as described in Steps A1 and A2), a distance from the first surface of the lower well region 2011 to the N-type drift region 202 is greater than a distance from the second surface of the upper well region 2012 to the N-type drift region 202. A semiconductor device formed using the above exemplary method will have a higher breakdown voltage compared to a conventional LDMOS having a same saturated drain current (IdSat) as the semiconductor device. Accordingly, the semiconductor device formed using the above exemplary method has both higher breakdown voltage and improved performance.

In one set of simulation experiments, the saturated drain current (IdSat) and breakdown voltage are determined and compared for different ion implantation angles, as shown by the following table:

| Ion implantation angle (degree) | Saturated drain current IdSat (A) | Breakdown voltage (V) |
|---|---|---|
| 0 | $3.70 \times 10^{-4}$ | 31.73 |
| 15 | $3.86 \times 10^{-4}$ | 32.26 |
| 30 | $3.90 \times 10^{-4}$ | 31.73 |

The case in which the implantation angle is zero (0) degree is used as a reference. As shown in the above table, when the implantation angle is 15 degrees, the saturated drain current (IdSat) and breakdown voltage are $3.86\times10^{-4}$ A and 32.26V respectively, which are higher compared to the reference saturated drain current (IdSat) and breakdown voltage ($3.70\times10^{-4}$ A and 31.73V). However, when the implantation angle is 30 degrees, the breakdown voltage is the same as the reference breakdown voltage (31.73), but the saturated drain current (IdSat) is higher than the case in which the implantation angle is 15 degrees ($3.90\times10^{-4}$ A versus $3.86\times10^{-4}$ A). Accordingly, it is observed that when the implantation angle is an acute angle, both the breakdown voltage and the performance of the semiconductor device (LDMOS device) can be improved.

According to the exemplary method described in FIGS. 3A through 3D, a P-well of a semiconductor device is formed by using a first ion implantation having an acute implantation angle to form a lower well region of the P-well, and by using a second ion implantation having a zero degree implantation angle to form an upper well region of the P-well. The lower well region includes a first surface that is near an N-type drift region, and the upper well region includes a second surface that is near the N-type drift region. A distance from the first surface of the lower well region to the N-type drift region is greater than a distance from the second surface of the upper well region to the N-type drift region. Accordingly, the semiconductor device formed using the above exemplary method has both higher breakdown voltage and improved performance.

FIG. 4 is a flowchart illustrating a method of manufacturing a semiconductor device according to an embodiment. The method may include some or all of the steps described in FIGS. 3A through 3D (for example, Steps A1 through A4). The method includes the following steps:

Step S101: forming a mask layer on a semiconductor substrate, wherein the mask layer is used in forming a P-well; and performing a first ion implantation on the semiconductor substrate through the mask layer to form a lower well region, wherein an implantation angle of the first ion implantation is an acute angle.

Step S102: performing a second ion implantation on the semiconductor substrate through the mask layer so as to form an upper well region, wherein an implantation angle of the second ion implantation process is zero degree, wherein the upper well region is disposed above the lower well region, wherein the upper well region and the lower well region collectively constitute the P-well, wherein the lower well region includes a first surface that is near the N-type drift region, and the upper well region includes a second surface that is near the N-type drift region, and wherein a distance from the first surface of the lower well region to the N-type drift region is greater than a distance from the second surface of the upper well region to the N-type drift region.

Step S103: removing the mask layer.

It is noted that the semiconductor device of FIG. 2, or a semiconductor device manufactured using the methods of FIGS. 3A, 3B, 3C, 3D, and/or 4, may be incorporated into an electronic apparatus. The semiconductor device may be connected to other electronic components. The electronic components may include transistors or other types of electronic components. In some embodiments, the semiconductor device can be formed on a chip that is then incorporated into the electronic apparatus.

The electronic apparatus may include mobile phones, tablet PCs, laptops, netbooks, game consoles, TVs, VCD players, DVD players, navigation systems, cameras, video cameras, voice recorders, MP3/MP4 players, PSPs, and any other electronic products or devices. The semiconductor device may also be incorporated into an intermediate product. The intermediate product may be used as stand-alone device, or integrated with other components to form a finished electronic product or device. Since the electronic apparatus includes the semiconductor device, the electronic apparatus therefore inherits its desirable characteristics (for example, higher breakdown voltage and improved performance).

Embodiments of a semiconductor device, a method of manufacturing the semiconductor device, and an electronic apparatus including the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

Different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept. Therefore, the inventive concept should not be limited to the foregoing disclosure, but rather construed by the claims appended hereto.

What is claimed is:

1. A method of manufacturing a semiconductor device, comprising:
    forming an N-type drift region and a P-well in a semiconductor substrate, wherein forming the P-well further comprises:
    forming a mask layer on the semiconductor substrate;
    performing a first ion implantation on the semiconductor substrate through the mask layer so as to form a lower well region, wherein an implantation angle of the first ion implantation process is an acute angle and wherein neither the semiconductor substrate nor the mask layer has any rotary movement during the first ion implantation;
    performing a second ion implantation on the semiconductor substrate through the mask layer so as to form an upper well region, wherein an implantation angle of the second ion implantation process is zero degree, wherein the upper well region is disposed above the lower well region, wherein the upper well region and the lower well region collectively constitute the P-well, wherein the lower well region includes a first surface that is near the N-type drift region, and the upper well region includes a second surface that is near the N-type drift region, and wherein a distance from the first surface of the lower well region to the N-type drift region is greater than a distance from the second surface of the upper well region to the N-type drift region; and
    removing the mask layer.

2. The method according to claim 1, wherein the first surface of the lower well region is a sloped surface, and wherein a distance from an upper portion of the sloped surface to the N-type drift region is less than a distance from a lower portion of the sloped surface to the N-type drift region.

3. The method according to claim 1, wherein the first ion implantation has an energy ranging from about 480 Kev to about 1000 Kev, and an ion dosage ranging from about $1 \times 10^{12}/cm^3$ to about $5 \times 10^{12}/cm^3$.

4. The method according to claim 1, wherein the first ion implantation includes using boron ions, and wherein the implantation angle of the first ion implantation process ranges from about 5 degrees to about 45 degrees.

5. The method according to claim 1, wherein the second ion implantation has an energy ranging from about 0 Kev to about 480 Kev, and an ion dosage greater than about $3 \times 10^{12}/cm^3$.

6. The method according to claim 1, wherein the second ion implantation includes using boron ions.

7. The method according to claim 1, further comprising:
    forming a source in the P-well, a drain in the N-type drift region, and a gate on the semiconductor substrate.

* * * * *